United States Patent [19]

Thulke et al.

[11] Patent Number: 5,222,087
[45] Date of Patent: Jun. 22, 1993

[54] TTG-DFB LASER DIODE

[75] Inventors: Wolfgang Thulke, Munich; Stefan Illek, Feldkirchen-Westerham, both of Fed. Rep. of Germany

[73] Assignee: Siemens Aktiengesellschaft, Munich, Fed. Rep. of Germany

[21] Appl. No.: 872,405

[22] Filed: Apr. 23, 1992

[30] Foreign Application Priority Data

Jul. 26, 1991 [DE] Fed. Rep. of Germany ....... 4124873

[51] Int. Cl.$^5$ ............................. H01S 3/10; H01S 3/08
[52] U.S. Cl. ............................. 372/20; 372/96; 372/46
[58] Field of Search ................ 372/20, 96, 45, 46, 372/47, 50

[56] References Cited

U.S. PATENT DOCUMENTS

| 5,008,893 | 4/1991 | Amann et al. | 372/50 |
| 5,048,049 | 9/1991 | Amann | 372/96 |
| 5,101,414 | 3/1992 | Schilling et al. | 372/50 |

FOREIGN PATENT DOCUMENTS 0360011  3/1990  European Pat. Off. .

Primary Examiner—Georgia Y. Epps
Attorney, Agent, or Firm—Hill, Steadman & Simpson

[57] ABSTRACT

A TTG-DFB laser diode on a doped substrate having a stripe-shaped layer structure that has an intermediate layer between an active layer and a tuning layer. A confinement layer laterally adjoins this layer structure at both sides, is doped for the same conductivity type as the substrate and is electrically conductively connected to the substrate through an interruption of the layers situated therebelow. An upper region, that respectively extends up to the surface and that is oppositely doped, is formed in the confinement layer above the layer structure. A lateral region, separated therefrom and that is electrically conductively connected via a lower confinement layer to a side of the layer structure facing toward the substrate, is formed in the confinement layer. Contact layers and contacts are applied on the upper region and on the lateral region, and a contact is applied on the substrate, so that separate current injection into both the active layer and the tuning layer is possible through the intermediate layer.

20 Claims, 1 Drawing Sheet

TTG-DFB LASER DIODE

BACKGROUND OF THE INVENTION

The present invention is directed to a laser diode with an electrically tunable emission wavelength having a TTG-DFB (tuneable twin guide-distributed (feedback) structure. p The TTG-DFB laser diode of European Patent Application EP 0 360 011 is considered especially suitable for utilization in future optical communication transmission systems because of its broad, continuously variable tunability of the emission wavelength. Its employment, for example, as a local oscillator in optical heterodyne receivers is promising. In this laser diode, an active layer and a tunable layer are arranged vertically one above the other and separated by an intermediate layer, whereby separate current injections into the tuning layer and into the active layer can occur via lateral regions and through the intermediate layer. In prior art embodiments this TTG-DFB laser diode is constructed on a p-doped substrate. One of the two critical laser layers, i.e. the active layer or the tuning layer, is electrically driven via the substrate depending on which layer is located on the side of the intermediate layer facing toward the substrate. The substrate must therefore be electrically insulated from sub-carriers that are to be frequently equated with the electrical ground, this requirement increasing the manufacturing outlay.

SUMMARY OF THE INVENTION

It is an object of the present invention to provide a TTG-DFB laser diode wherein a common potential for the drive of the active layer and of the tuning layer can be applied via the substrate.

This object is achieved by a laser diode on a substrate doped for electrical conduction of a first conductivity type and having a stripe-shaped layer structure that has an intermediate layer between two predetermined layers. At least one of the two predetermined layers is an active layer provided for generating a beam. A confinement layer laterally adjoins this layer structure at both sides, is essentially doped for the first conductivity type and is electrically conductively connected to the substrate. An upper region that is doped for an opposite, second conductivity type and a lateral region separated therefrom, that is doped for this second conductivity type and that is electrically conductively connected to that side of the layer structure facing toward the substrate, are fashioned. A central contact layer is applied on the upper region and a lateral contact layer is applied on the lateral region. Contacts are applied on the central contact layer, on the lateral contact layer and on the substrate, so that separate current injection is possible through the intermediate layer into each of the predetermined layers.

Further developments of the present invention are as follows. A lower confinement layer doped for the second conductivity type is provided, this lower confinement layer electrically connecting the lateral region to that side of the layer structure facing toward the substrate. The upper region can be formed by an upper layer of the confinement layer. The upper region adjoins a stripe-shaped protective layer of the layer structure that is doped for the second conductivity type. The lateral region can be formed by a lateral, upper layer of the confinement layer. A semi-insulating layer is provided that insulates the substrate from semiconductor material doped for the second conductivity type. One of the predetermined layers is a tuning layer provided for wavelength variation. The tuning layer can be arranged on that side of the intermediate layer facing toward the substrate or the tuning layer can be arranged at that side of the intermediate layer facing away from the substrate.

In the laser diode of the present invention, a lateral region via which the current flow into the intermediate layer occurs is connected to the conductive substrate. Those sides of the active layer and of the tuning layer respectively facing away from the intermediate layer are connected to oppositely doped semiconductor material that is contacted on the surface of the component.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
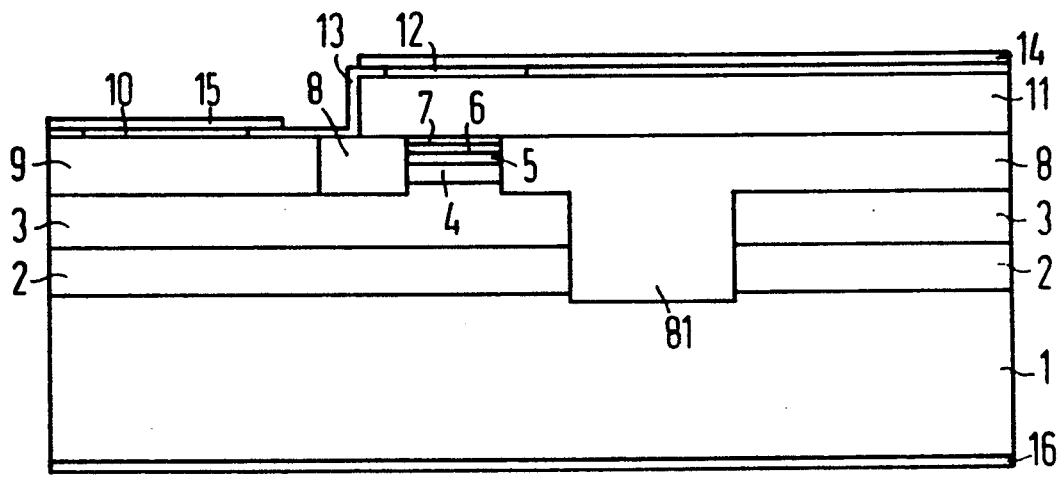
FIG. 1 is a cross-sectional view of a laser diode of the present invention in a first embodiment.

In the TTG-DFB laser diode of the present invention depicted in FIG. 1, a layer sequence is applied on an n-conductive substrate 1 that serves as an electrical ground and is provided with a contact 16 at its under side. The operational signs of the respective dopings that are recited for this exemplary embodiment can also be opposite. A semi-insulating layer 2 and a p-conductively doped, lower confinement layer 3 is located directly on the substrate. Given, for example, a sulfur-doped InP substrate, the semi-insulating layer 2 can, for example, be InP that is rendered semi-insulating with iron and the lower confinement layer 3 can be zinc-doped InP. The lower confinement layer 3 is so thick and its doping is so high that an adequately low shunt resistance of a few ohms on a width of 10 through 20 $\mu$m is guaranteed.

The semiconductors layers for the laser structure are applied onto lower confinement layer 3 and are structured as a narrow stripe. The structure comprises a tuning layer 4 (for example, InGaAsP having the wavelength 1.3 $\mu$m), and n-doped intermediate layer 5 (for example, InP:Sn), an active layer 6 (for example, having the wavelength 1.55 $\mu$m) and, potentially, a p-conductively doped protective layer 7 (for example, zinc-doped InP). The tuning layer 4 can also be arranged above the intermediate layer 5; the active layer 6 is then situated under the intermediate layer 5. The tuning layer 4 can contain a lattice corrugation; this can also be localized in another layer (not shown here) in the proximity of the laser layers.

This stripe is laterally embedded into an n-conductive confinement layer 8 (for example tin-doped InP). This confinement layer 8 also fills out an interruption 81 of the semi-insulating layer 2 and the lower confinement layer 3 to the side of the laser ridge so that the confinement layer 8 is electrically conductively connected to the substrate 1 through this interruption 81 that extends trench-like over the entire length of the laser stripe. An n-conductive connection to the intermediate layer 5 can therefore be produced via the contact 16 and through the substrate 1 and the confinement layer 8. A central current injection into the intermediate layer 5 proceeding from the substrate 1 is therefore possible. The contact 16 is connected to, for example, a ground potential. The interruption 81 is situated at one side of the laser stripe. The n-conductively doped part of the confinement layer 8 is only a few micrometers wide along the laser stripe at the other side of the laser stripe. A p-conductive, lateral region 9 (for example, zinc-doped InP) laterally adjoins the side facing away from the laser stripe. This lateral region 9 can be formed by a redoped part of the confinement layer 8 or by a separately applied, p-conductively doped, lateral layer. A stripe-shaped, highly p-conductively doped contact layer 10 (for example, zinc-doped InGaAs) is applied onto this lateral region 9. An electrically conductive connection to the lowest laser layer (tuning layer 4) can be produced through the lateral region 9 and the lower confinement layer 3 situated therebelow by means of contact 15 applied onto this contact layer 10.

The laser ridge embedded into the confinement layer 8 is covered at the top by a p-conductively doped, upper region that is formed by a further, p-conductively doped, upper confinement layer 11 (for example, zinc-doped InP) that leaves free the contact 15 on the p-conductively doped lateral region 9. A highly p-conductively doped contact layer 12 is applied stripe-shaped along the laser stripe on this upper region 11; this contact layer 12, for example, is zinc-doped InGaAs and is electrically conductively connected to the uppermost laser layer (active layer 6). The upper region 11 extends only a few micrometers beyond the laser ridge at that side of the ridge facing away from the interruption 81, so that no conductive connection is present between the upper region 11 and the lateral region 9.

The two stripe-shaped contact layers 10 and 12 are insulated from one another by an oxide layer 13 that covers the surface of the layer sequence outside the contact stripes. A contact 14 is also situated on the contact layer 12 over the laser ridge.

Figure 2:
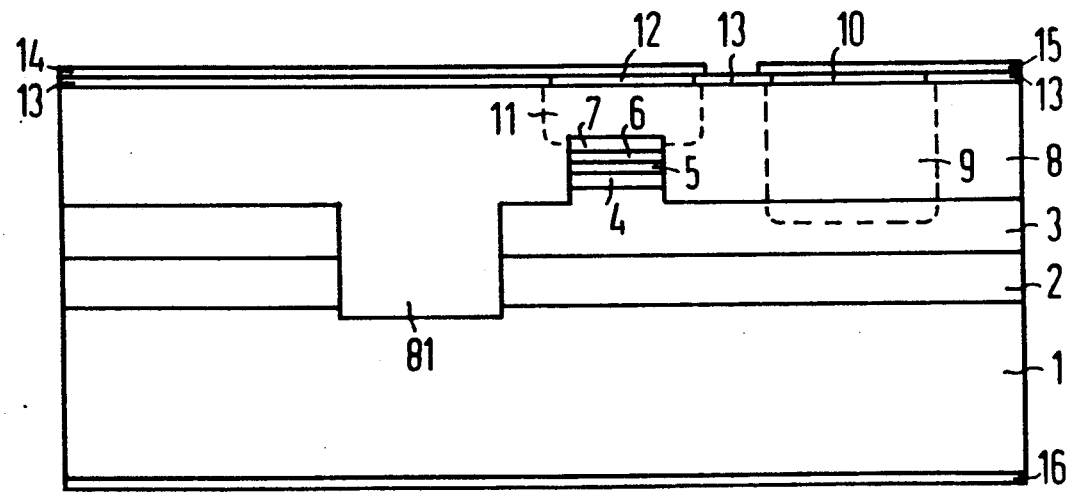
FIG. 2 is a cross-sectional view of a laser diode of the present invention in a second embodiment.

As layer portion of the confinement layer 8, the upper confinement layer 11 can have a planar surface, as shown in FIG. 2. In the exemplary embodiment of FIG. 2, the p-conductively doped lateral region 9 on that side of the laser stripe lying opposite the interruption 81 is formed such that it extends down into the lower confinement layer 3 and the p-conductively doped, upper region 11 is formed above the laser stripe and extends down into the uppermost, p-conductively doped layer of this laser stripe. The remainder of the structure corresponds to that of FIG. 1.

Advantages of the TTG-DFB laser diode of the present invention are the construction on a conductive substrate as common electrical ground potential for the active layer and for the tuning layer and the good integratability of the laser structure with other electronic and opto-electronic function elements on the same substrate. These additional function elements can be arranged on the semi-insulating layer 2 electrically insulated from one another.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A laser diode on a substrate doped for electrical conduction of a first conductivity type, comprising:
    a stripe-shaped layer structure having an intermediate layer located between two predetermined layers, at least one layer of said two predetermined layers being an active layer provided for generating a light emission;
    a confinement layer laterally adjoining the stripe-shaped layer structure at both sides thereof, the confinement layer being substantially doped for the first conductivity type and being electrically conductively connected to the substrate;
    an upper region at least over the stripe-shaped layer structure, the upper region being doped for a second conductivity type, the second conductivity type being opposite the first conductivity type, and a lateral region, that is doped for the second conductivity type, electrically conductively connected to a side of the stripe-shaped layer structure facing toward the substrate;
    a central contact layer on the upper region and a lateral contact layer on the lateral region, the lateral region being separate from the upper region; and
    respective contacts on the central contact layer, on the lateral contact layer and on the substrate, so that separate current injection is provided through the intermediate layer into each of the two predetermined layers.

2. The laser diode according to claim 1, wherein the laser diode further comprises a lower confinement layer doped for the second conductivity type that electrically connects the lateral region to the side of the layer structure facing toward the substrate.

3. The laser diode according to claim 1, wherein the upper region is formed by an upper layer of the confinement layer.

4. The laser diode according to claim 1, wherein the upper region adjoins the stripe-shaped protective layer of the layer structure that is doped for the second conductivity type.

5. The laser diode according to claim 1, wherein the lateral region is formed by a lateral, upper layer of the confinement layer.

6. The laser diode according to claim 1, wherein the laser diode further comprises a semi-insulating layer on the substrate that insulates the substrate from semiconductor material doped for the second conductivity type.

7. The laser diode according to claim 1, wherein one of the two predetermined layers is a tuning layer provided for wavelength variation of the laser diode.

8. The laser diode according to claim 7, wherein the tuning layer is arranged on a side of the intermediate layer facing toward the substrate.

9. The laser diode according to claim 7, wherein the tuning layer is arranged at a side of the intermediate layer facing away from the substrate.

10. A laser diode on a substrate doped for electrical conduction of a first conductivity type, comprising:
    a stripe-shaped layer structure having an intermediate layer located between two predetermined layers, at least one layer of said two predetermined layers being an active layer provided for generating a light emission;

a confinement layer laterally adjoining the stripe-shaped layer structure at both sides thereof, the confinement layer being substantially doped for the first conductivity type and being electrically conductively connected to the substrate;

an upper region at least over the stripe-shaped layer structure, the upper region being doped for a second conductivity type, the second conductivity type being opposite the first conductivity type, and a lateral region, that is doped for the second conductivity type, electrically conductively connected to a side of the stripe-shaped layer structure facing toward the substrate;

a lower confinement layer doped for the second conductivity type that electrically connects the lateral region to the side of the layer structure facing toward the substrate;

a central contact layer on the upper region and a lateral contact layer on the lateral region, the lateral region being separate from the upper region;

respective contacts on the central contact layer, on the lateral contact layer and on the substrate, so that separate current injection is provided through the intermediate layer into each of the two predetermined layers; and a semi-insulating layer on the substrate that insulates the substrate from semiconductor material doped for the second conductivity type.

11. The laser diode according to claim 10, wherein the upper region is formed by an upper layer of the confinement layer.

12. The laser diode according to claim 10, wherein the upper region adjoins the stripe-shaped protective layer of the layer structure that is doped for the second conductivity type.

13. The laser diode according to claim 10, wherein the lateral region is formed by a lateral, upper layer of the confinement layer.

14. The laser diode according to claim 10, wherein one of the two predetermined layers is a tuning layer provided for wavelength variation of the laser diode.

15. The laser diode according to claim 10, wherein the tuning layer is arranged on a side of the intermediate layer facing toward the substrate.

16. The laser diode according to claim 10, wherein the tuning layer is arranged at a side of the intermediate layer facing away from the substrate.

17. A laser diode on a substrate doped for electrical conduction of a first conductivity type, comprising:

a stripe-shaped layer structure having an intermediate layer located between two predetermined layers, one layer of said two predetermined layers being an active layer provided for generating a light emission and the other layer of the two predetermined layers being a tuning layer provided for wavelength variation of the laser diode;

a confinement layer laterally adjoining the stripe-shaped layer structure at both sides thereof, the confinement layer being substantially doped for the first conductivity type and being electrically conductively connected to the substrate;

an upper region at least over the stripe-shaped layer structure, the upper region being doped for a second conductivity type, the second conductivity type being opposite the first conductivity type, and a lateral region, that is doped for the second conductivity type, electrically conductively connected to a side of the stripe-shaped layer structure facing toward the substrate;

a central contact layer on the upper region and a lateral contact layer on the lateral region, the lateral region being separate from the upper region; and respective contacts on the central contact layer, on the lateral contact layer and on the substrate, so that separate current injection is provided through the intermediate layer into each of the two predetermined layers.

18. The laser diode according to claim 17, wherein the laser diode further comprises a lower confinement layer doped for the second conductivity type that electrically connects the lateral region to the side of the layer structure facing toward the substrate; and wherein the upper region is formed by an upper layer of the confinement layer.

19. The laser diode according to claim 17, wherein the upper region adjoins the stripe-shaped protective layer of the layer structure that is doped for the second conductivity type.

20. The laser diode according to claim 17, wherein the tuning layer is arranged at a side of the intermediate layer facing away from the substrate.

* * * * *